United States Patent
Takeuchi et al.

(10) Patent No.: US 11,146,040 B2
(45) Date of Patent: Oct. 12, 2021

(54) SEMICONDUCTOR MULTILAYER FILM REFLECTING MIRROR AND VERTICAL CAVITY LIGHT-EMITTING ELEMENT

(71) Applicants: MEIJO UNIVERSITY, Nagoya (JP); STANLEY ELECTRIC CO., LTD., Tokyo (JP)

(72) Inventors: Tetsuya Takeuchi, Aichi (JP); Isamu Akasaki, Aichi (JP); Kazuki Kiyohara, Tokyo (JP); Masaru Takizawa, Tokyo (JP); Ji-Hao Liang, Tokyo (JP)

(73) Assignees: MEIJO UNIVERSITY, Nagoya (JP); STANLEY ELECTRIC CO., LTD., Tokyo (JP)

(*) Notice: Subject to any disclaimer, the term of this patent is extended or adjusted under 35 U.S.C. 154(b) by 73 days.

(21) Appl. No.: 16/498,385

(22) PCT Filed: Mar. 13, 2018

(86) PCT No.: PCT/JP2018/009656
§ 371 (c)(1),
(2) Date: Sep. 26, 2019

(87) PCT Pub. No.: WO2018/180450
PCT Pub. Date: Oct. 4, 2018

(65) Prior Publication Data
US 2021/0111538 A1    Apr. 15, 2021

(30) Foreign Application Priority Data
Mar. 27, 2017 (JP) .............................. JP2017-060345

(51) Int. Cl.
*H01S 5/183* (2006.01)

(52) U.S. Cl.
CPC ................. *H01S 5/18361* (2013.01)

(58) Field of Classification Search
CPC ...... H01S 5/18361; H01L 33/00; H01L 33/46; H01L 29/157
USPC .......................................... 372/44.01; 257/89
See application file for complete search history.

(56) References Cited

U.S. PATENT DOCUMENTS

| 5,834,331 A * | 11/1998 | Razeghi | ................ B82Y 20/00 438/40 |
| 6,121,638 A * | 9/2000 | Rennie | .................. B82Y 20/00 257/103 |
| 6,508,878 B2 * | 1/2003 | Kim | ...................... C30B 29/403 117/89 |

(Continued)

FOREIGN PATENT DOCUMENTS

| JP | 2002261393 A | 9/2002 |
| JP | 2003101141 A | 4/2003 |

(Continued)

OTHER PUBLICATIONS

International Search Report (ISR) (and English translation thereof) dated Jun. 12, 2018 issued in International Application No. PCT/JP2018/009656.

(Continued)

*Primary Examiner* — Tuan N Nguyen
(74) *Attorney, Agent, or Firm* — Holtz, Holtz & Volek PC

(57) ABSTRACT

Included is a semiconductor multilayer film in which a non-doped InAlN layer and a GaN layer formed on said InAlN layer and containing a dopant are stacked a plurality of times.

9 Claims, 5 Drawing Sheets

(56) References Cited

U.S. PATENT DOCUMENTS

| | | | |
|---|---|---|---|
| 6,515,308 B1 | 2/2003 | Kneissl et al. | |
| 6,526,083 B1 * | 2/2003 | Kneissl | B82Y 20/00 |
| | | | 372/50.22 |
| 2002/0146854 A1 * | 10/2002 | Koide | B82Y 20/00 |
| | | | 438/22 |
| 2003/0047744 A1 | 3/2003 | Yanamoto | |
| 2010/0224892 A1 | 9/2010 | Nakahara | |
| 2011/0073888 A1 * | 3/2011 | Ueno | H01L 33/32 |
| | | | 257/94 |
| 2016/0163919 A1 | 6/2016 | Matsui et al. | |

FOREIGN PATENT DOCUMENTS

| | | |
|---|---|---|
| JP | 2007200995 A | 8/2007 |
| JP | 2015079842 A | 4/2015 |
| JP | 2016111131 A | 6/2016 |

OTHER PUBLICATIONS

Written Opinion of the International Searching Authority dated Jun. 12, 2018 issued in International Application No. PCT/JP2018/009656.

Berger, et al., "Growth of AlInN/GaN distributed Bragg reflectors with improved interface quality," Journal of Crystal Growth, 414 (Mar. 2015), pp. 105-109, Elsevier, online: <http://www.elsevier.com/locate/jcrysgro>.

Japanese Office Action (and English language translation thereof) dated Jan. 5, 2021 issued in counterpart Japanese Application No. 2017-060345.

* cited by examiner (a)

(b)

SEMICONDUCTOR MULTILAYER FILM REFLECTING MIRROR AND VERTICAL CAVITY LIGHT-EMITTING ELEMENT

TECHNICAL FIELD

The present invention relates to a multilayer film reflecting mirror and a vertical cavity light-emitting element such as a vertical cavity surface emitting laser (VCSEL: Vertical Cavity Surface Emitting Laser) formed from a semiconductor material.

BACKGROUND ART

A vertical cavity surface emitting laser (hereinafter simply referred to as a surface emitting laser) is a semiconductor laser having a multilayer film reflecting mirror on a substrate and causing light to resonate perpendicularly to the surface of the substrate by the multilayer film. For example, Non-Patent Literature 1 discloses a multilayer film reflecting mirror which might be formed of InGaN and GaN.

CITATION LIST

Patent Literature

Non-Patent Literature 1: Journal of Crystal Growth (2014), citations 6, reads 136

SUMMARY OF INVENTION

Technical Problem

For example, a vertical cavity light-emitting element such as a surface emitting laser has reflecting mirrors opposite to each other with an active layer interposed therebetween, so that the reflecting mirrors constitute a resonator. In the surface emitting laser, the light emitted from the active layer is caused to resonate in the resonator (laser oscillation), and the light having resonated is extracted to the outside. In order to reduce the lasing threshold of the surface emitting laser, it is preferable to provide a reflecting mirror having a high reflectance.

Examples of the reflecting mirrors used in the vertical cavity light-emitting element, include a multilayer film reflecting mirror in which a plurality of thin films having different refractive indices are stacked. In order to obtain a desired reflectance with a small number of layers in the multilayer film reflecting mirror, it is preferable that the refractive index change abruptly at the interface of each layer, that is, the refractive index difference at the interface of each layer be remarkable. In addition, it is preferable that the interface of each layer be flat.

The present invention has been made in view of the foregoing problems, and it is an object of the present invention to provide a multilayer film reflecting mirror having a high reflectance with a small number of layers, and a vertical cavity light-emitting element having the multilayer film reflecting mirror to possess a low lasing threshold.

Solution to Problem

A semiconductor multilayer film reflecting mirror according to the present invention comprising: a substrate; and a semiconductor multilayer film which is formed on the substrate and in which a non-doped InAlN layer, and a GaN layer formed on the InAlN layer and containing a dopant are stacked a plurality of times.

A vertical cavity light-emitting element according to the present invention comprising: a semiconductor structure layer including a first semiconductor layer having a first conductivity type, an active layer, and a second semiconductor layer having a second conductivity type opposite to the first conductivity type; and first and second reflecting mirrors opposite to each other with the semiconductor structure layer interposed therebetween, wherein the first reflecting mirror is formed from a semiconductor multilayer film in which a non-doped InAlN layer and a GaN layer formed on the InAlN layer and containing a dopant are stacked a plurality of times.

DESCRIPTION OF EMBODIMENTS

Hereinafter, embodiments of the present invention will be described in detail. In the following embodiments, a surface emitting laser (semiconductor laser) will be described. However, the present invention can be applied not only to a surface emitting laser but also to a vertical cavity light-emitting element.

First Embodiment

Figure 1:
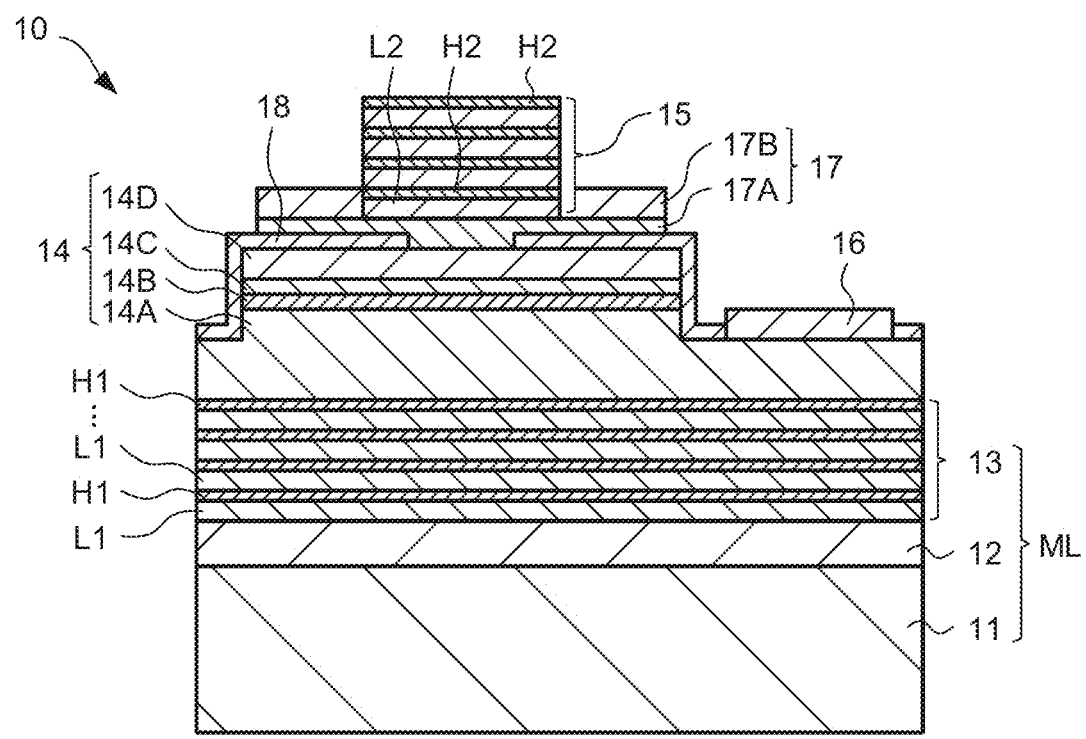
FIG. 1 is a cross-sectional view of a surface emitting laser according to a first embodiment.

FIG. 1 is a cross-sectional view of a vertical cavity surface emitting laser (VCSEL: Vertical Cavity Surface Emitting Laser) 10 according to a first embodiment. The surface emitting laser 10 has first and second reflecting mirrors 13 and 15 which are disposed to be opposite to each other with a semiconductor structure layer 14 (light-emitting structure layer), including an active layer 14B, interposed therebetween.

The surface emitting laser 10 has a structure in which the first reflecting mirror 13, the semiconductor structure layer 14, and the second reflecting mirror 15 are stacked on a substrate 11. Specifically, a buffer layer 12 is formed on the substrate 11, and the first reflecting mirror 13 is formed on the buffer layer 12. The semiconductor structure layer 14 is formed on the first reflecting mirror 13, and the second reflecting mirror 15 is formed on the semiconductor structure layer 14. In this embodiment, the substrate 11 is a GaN substrate. The buffer layer 12 has a composition of GaN.

The first reflecting mirror 13 is formed from a semiconductor multilayer film in which a low refractive index semiconductor layer L1 and a high refractive index semiconductor layer H1 having a refractive index larger than that of the low refractive index semiconductor layer L1 are alternately stacked a plurality of times. In this embodiment, the low refractive index semiconductor layer L1 is an InAlN layer. The high refractive index semiconductor layer H1 is a GaN layer. In this embodiment, the substrate 11, the buffer layer 12, and the first reflecting mirror 13 constitute a semiconductor multilayer film reflecting mirror ML having the first reflecting mirror 13 as a semiconductor multilayer film.

Further, in this embodiment, the second reflecting mirror 15 is a dielectric multilayer film reflecting mirror in which a low refractive index dielectric layer L2 and a high refractive index dielectric layer H2 having a refractive index larger than that of the low refractive index dielectric layer L2 are alternately stacked. In this embodiment, the low refractive index dielectric layer L2 is formed from an $SiO_2$ layer, and the high refractive index dielectric layer H2 is formed from an $Nb_2O_5$ layer.

In other words, in this embodiment, the first reflecting mirror 13 is a distributed Bragg reflector (DBF: Distributed Bragg Reflector) formed of a semiconductor material, and the second reflecting mirror 15 is a distributed Bragg reflector formed of a dielectric material.

The semiconductor structure layer (light-emitting structure layer) 14 has a structure in which an n-type semiconductor layer (first semiconductor layer having a first conductivity type) 14A, the active layer 14B, an electron blocking layer 14C, and a p-type semiconductor layer (second semiconductor layer having a second conductivity type opposite to the first conductivity type) 14D are stacked. In this embodiment, the semiconductor structure layer 14 has a composition of $Al_xIn_yGa_{1-x-y}N$ ($0 \le x \le 1$, $0 \le y \le 1$, and $0 \le x+y \le 1$).

For example, the n-type semiconductor layer 14A and the p-type semiconductor layer 14D each are formed from a GaN layer. The active layer 14B has a multiple quantum well structure formed from an InGaN layer and a GaN layer. The electron blocking layer 14C is formed from an AlGaN layer. Note that the semiconductor structure layer 14 only needs to include the n-type semiconductor layer 14A, the active layer 14R, and the p-type semiconductor layer 14D, and needs not to include the electron block 14C.

The surface emitting laser 10 has an n-electrode (first electrode) 16 connected to the n-type semiconductor layer 14A of the semiconductor structure layer 14, and a p-electrode (second electrode) 17 connected to the p-type semiconductor layer 14O. The n-electrode 17 is formed on the n-type semiconductor layer 14A. The p-electrode 17 is formed on the p-type semiconductor layer 14D.

Specifically, in this embodiment, the p-type semiconductor layer 14D, the electron blocking layer 14C, and the active layer 14B are partially removed from the semiconductor structure layer 14, and the n-electrode 16 is formed on the top surface of the n-type semiconductor layer 14A exposed after the removal.

An insulating film 13, which covers the side surface and the top surface of the semiconductor structure layer 14 and has an opening for exposing part of the p-type semiconductor layer 14O, is formed on the semiconductor structure layer 14. The p-electrode 17 is formed from a translucent electrode 17A which is formed on the insulating film 18 by filling the opening, and is in contact with the p-type semiconductor layer 14D exposed from the opening, and a connection electrode 17B formed on the translucent electrode 17A. The insulating film 18 functions as a current confinement layer.

In this embodiment/the second reflecting mirror 15 is formed on the translucent electrode 17A of the p-electrode 13 in a region above the opening of the insulating film 18. The connection electrode 17B is formed on the translucent electrode 17A so as to surround the second reflecting mirror 15. The second reflecting mirror 15 is opposite to the first reflecting mirror 13 via the translucent electrode 17A and the semiconductor structure layer 14.

An outline of the light-emitting operation of the surface emitting laser 10 will be described with reference to FIG. 1. First, in the surface emitting laser 10, the first and second reflecting mirrors 13 and 15 opposite to each other constitute a resonator. The light emitted from the semiconductor structure layer 14 (active layer 14E) is repeatedly reflected between the first and second reflecting mirrors 13 and 15 to reach a resonance state (to perform laser oscillation). Part of the resonance light passes through the second reflecting mirror 15 to be taken out to the outside. In this manner, the surface emitting laser 10 emits light, in a direction perpendicular to the substrate 11.

Figure 2:
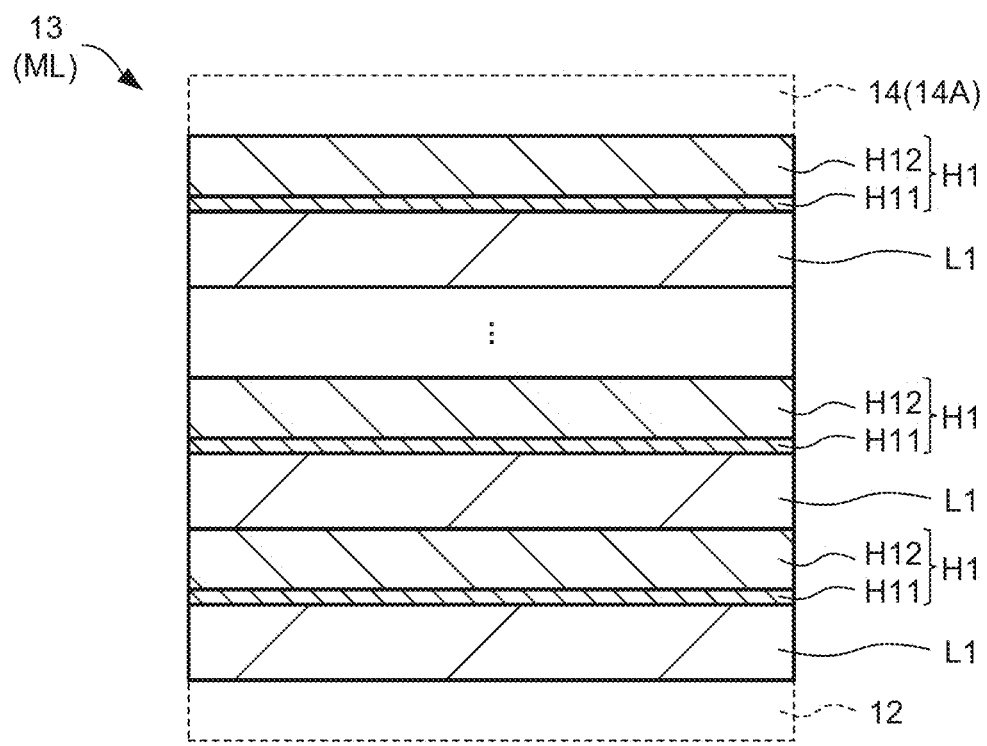
FIG. 2 is a cross-sectional view of a multilayer film reflecting mirror of the surface emitting laser according to the first embodiment.

FIG. 2 is a cross-sectional view of the first reflecting mirror 13 (the semiconductor multilayer film reflecting mirror ML). The structure of the first reflecting mirror 13 will be described with reference to FIG. 2. The first reflecting mirror 13 has a non-doped InAlN layer as the low refractive index semiconductor layer L1. The first reflecting mirror 13 is formed from a first GaN layer H11 containing Si as a dopant and a non-doped GaN layer H12 as the high refractive index semiconductor layer H1.

In other words, the first reflecting mirror 13 is formed from a semiconductor multilayer film in which the non-doped InAlN layer L1, the first GaN layer H11 formed on the InAlN layer L1 and containing Si as a dopant, and a non-doped second GaN layer formed on the first GaN layer H12 are stacked a plurality of times. In this embodiment, the first GaN layer H11 has an Si concentration of $3 \times 10^{18}$ atoms/$cm^2$ or less.

Here, a production method of the surface emitting laser 10, in particular, the first reflecting mirror 13 will be described. In this embodiment, a GaN substrate as the substrate 11 was prepared, and a semiconductor multilayer film as the first reflecting mirror 13 was grown on the GaN substrate by using a metalorganic chemical vapor deposition (MOCVD) method. In the following description, the low refractive index layer L1 is an InAlN layer, and the high refractive index layer H1 is a GaN layer.

Specifically, first, the GaN substrate 11 was placed in a reacting furnace of a growth system. $H_2$ and $NH_3$ were supplied into the reacting furnace and the substrate temperature was raised to 1070° C. After that, TMG was supplied onto the GaN substrate 11, so that a GaN layer of 100 nm serving as the buffer layer 12 was epitaxially grown (Step 1).

Next, after the temperature of the substrate was lowered to 930° C. (first temperature), the supply gases were switched from $H_2$ to $N_2$, and TMI and TMA were supplied thereto to grow the nan-doped InAlN layer L1 of 50 nm (Step 2).

Next, by supplying TEG and $Si_2H_6$ while maintaining the substrate temperature at 930° C., an Si-doped GaN layer of 5 nm was grown as the first GaN layer H11 of the GaN layer H1 (Step 3).

Subsequently, the supply gas was switched from $N_2$ to $H_2$, the substrate temperature was raised to 1070° C. (second temperature), and TMG was supplied to grow a non-doped GaN layer of 40 nm as the second GaN layer H12 of the GaN layer H1 (Step 4).

Thereafter, Steps 2 to 4 were repeated to grow a nonconductive DER formed of 40 pairs of InAlN/GaN. At the time of repeating Steps 2 to 4, the process returns to Step 2 after Step 4. That is, after the second GaN layer H12 was formed, the InAlN layer L1 was grown. Therefore, in this embodiment, the InAlN layer L1 is formed on the second GaN layer H12.

In this manner, the first reflecting mirror 13 can be formed. It should be noted that the layer thickness and number of each layer described above are only illustrative. The layer thickness of each layer can be adjusted according to the wavelength of light to be emitted from the designed active layer 14B. In addition, the above-mentioned substrate temperature and supply gases are only illustrative.

After that, the n-type semiconductor layer 14A, the active layer 14B, the electron blocking layer 14C, and the p-type semiconductor layer 14D were grown on the uppermost GaN layer H1 (the second GaN layer H12) to grow the semiconductor structure layer 14 (Step 5). In addition, the n-electrode 16 and the p-electrode 17 were formed on the substrate 11 (Step 6) to produce the surface emitting laser 10.

Figure 3:
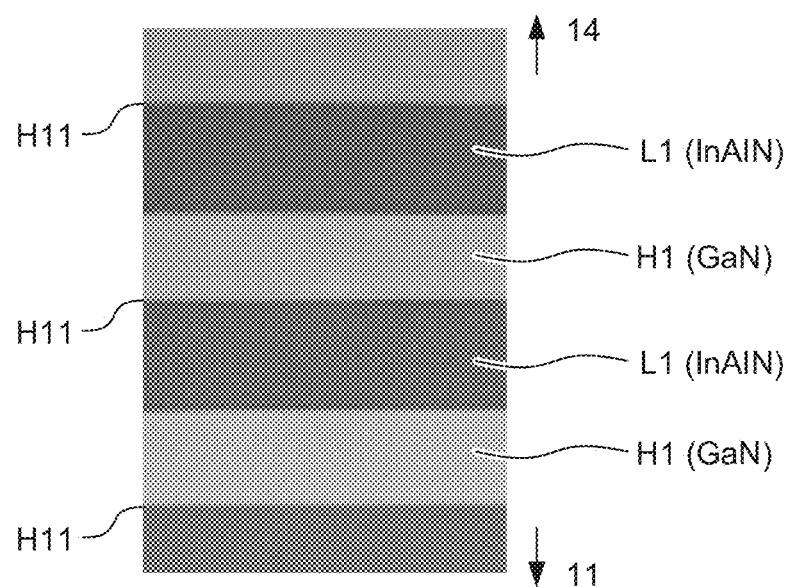
FIG. 3 is an observation image by an electron microscope of the multilayer film reflecting mirror according to the first embodiment.

FIG. 3 is a transmission electron microscope (TEM) observation image of the cross section of the first reflecting mirror 13. As shown in FIG. 3, the interface between the InAlN layer L1 and the GaN layer H1 is very abruptly formed. The interface between them is flat. This is because the Si-doped first GaN layer H11 was grown at a relatively low temperature after the growth of the InAlN layer L1.

Specifically, first, in consideration of crystallizability, GaN grows at a higher temperature than InAlN. When GaN is grown on InAlN, the higher growth temperatures cause In in the InAlN to be desorbed and diffused toward GaN. Therefore, it is difficult to form a clear interface between InAlN and GaN (abrupt composition change). On the other hand, when the first GaN layer H11 is grown on the InAlN layer L1 at a low temperature, In is prevented from diffusing into the GaN layer H1. Therefore, the difference in the composition at the interface between the InAlN layer L1 and the GaN layer H1, that is, the abrupt refractive index difference occurs.

In addition, when the InAlN layer L1 having a lattice constant different from that of the GaN substrate 11 is growth on the GaN substrate 11, pits (irregularities) caused by lattice mismatch between them are formed. The pits degrade the flatness of the surface of the InAlN layer L1. On the other hand, when an Si-doped GaN layer (first GaN layer H11) is grown on the InAlN layer L1, Si enters the pits to function to bury the pits.

Therefore, the flatness of the InAlN layer L1 is improved during the growth of the Si-doped GaN layer H11. Therefore, the interface between the InAlN layer L1 and the first GaN layer H11 is reliably flattened. In addition, the above-mentioned In desorption has a property that a large amount of In is likely to be desorbed from pits. When Si enters the pits, desorption of In and diffusion thereof into the GaN layer H1 are effectively suppressed. Therefore, the Si-doped first GaN layer H11 improves both the flatness of the interface between the InAlN layer H1 and the GaN layer H1 and the abruptness of the refractive index difference.

The inventors of the present application have confirmed that the flatness of the interface with the InAlN and the abruptness of the refractive index difference were clearly improved as compared with the case where a GaN layer not doped with Si was grown instead of the first GaN layer H11.

Figure 4:
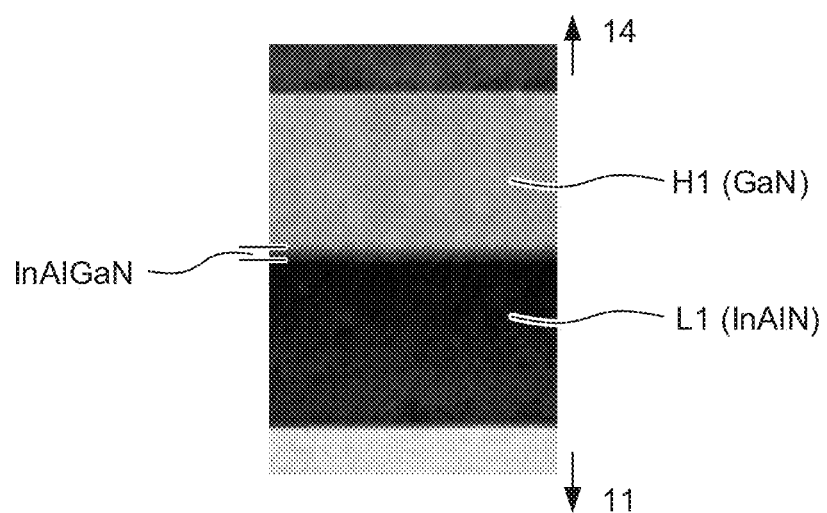
FIG. 4 is an observation image by an electron microscope of a multilayer film reflecting mirror according to a comparative example.

Specifically, as a comparative example of this embodiment, a semiconductor multilayer film was produced in which an InAlN layer L1 was first grown, a non-doped GaN layer was grown at a low temperature instead of the first GaN layer H11, and then a second GaN layer H12 was grown at a high temperature. FIG. 4 is a TEM image of the multilayer film reflecting mirror of the comparative example. When the comparative example was analyzed, an InAlGaN layer whose In composition gradually decreased toward the GaN layer was formed at the interface between the InAlN layer and the GaN layer. This is considered to be a result of In desorption from the InAlN layer at the time of growth of the GaN layer.

Note that the refractive index difference at the interface between the InAlN layer and the GaN layer in the comparative example was more moderate than the refractive index difference at the interface between the InAlN layer L1 and the GaN layer H1 in this embodiment. The multilayer film of the comparative example had degraded flatness of each layer than that of the first reflecting mirror 13 of this embodiment. Therefore, it is confirmed that the refractive index difference and flatness between the respective layers in the first reflecting mirror 13 are improved by providing the first GaN layer till doped with Si as in this embodiment.

In this embodiment, the Si concentration of the first GaN layer H11 is set to $3 \times 10^{18}$ atoms/cm$^3$ or less, but the Si concentration of the first GaN layer H11 may be $3 \times 10^{18}$ atoms/cm$^3$ or more, for example, may be $1 \times 10^{19}$ atoms/cm$^3$ or more. On the other hand, in this embodiment, the InAlN layer L1 and the second GaN layer H12, which are other layers of the first reflecting mirror 13, each are a non-doped layer and have a dopant concentration of, for example, $1 \times 10^{17}$ atoms/cm$^3$ or less. That is, the InAlN layer L1 is a non-doped layer, and the GaN layer H1 is a doped layer (a layer containing a dopant).

Therefore, in this embodiment, the first reflecting mirror 13 is formed from a semiconductor film which is not conductive as a whole. This improves the crystallizability of the first reflecting mirror 13, so that the first reflecting mirror 13 exhibits a high reflectance. It should be noted that the Si concentration of the first. GaN layer H11 and the dopant concentration of the other layers in the first reflecting mirror 13 are only illustrative.

In this embodiment, the InAlN layer L1 is formed on the second GaN layer H12. Specifically, when InAlN is grown after the growth of GaN, In desorption needs not to be considered. Therefore, even when the InAlN layer L1 is grown on the second GaN layer H12, a sufficiently abrupt refractive index difference occurs at the interface between the second GaN layer H12 and the InAlN layer L1. In consideration of the processing time, the processing cost, and the like, it is preferable that the InAlN layer L1 be formed on the second GaN layer H12.

As described above, in this embodiment, the surface emitting laser 10 (vertical cavity light-emitting element) includes the semiconductor structure layer 14 and the first and second reflecting mirrors 13 and 15 opposite to each other with the semiconductor structure layer 14 interposed therebetween. The first reflecting mirror 13 is formed from, a semiconductor multilayer film in which the non-doped InAlN layer L1, the first GaN layer H11 formed on the InAlN layer L1 and containing Si as a dopant, and the non-doped second GaN layer H12 formed on the first GaN layer H11 are stacked a plurality of times. Accordingly, it is possible to provide the vertical cavity light-emitting device 10 having the multilayer film reflecting mirror 13 having a high reflectance with a small number of layers to possess a low lasing threshold.

The semiconductor multilayer film reflecting mirror ML is formed from the GaN substrate 11 and the semiconductor multilayer film (first reflecting mirror 13) which is formed on the GaN substrate 11 and in which the non-doped InAlN layer L1, the first GaN layer H11 formed on the InAlN layer L1 and containing Si as a dopant, and the non-doped second GaN layer H12 formed on the first GaN layer H11 are stacked a plurality of times. Therefore, it is possible to provide the semiconductor multilayer film reflecting mirror ML having a high reflectance with a small number of layers.

Second Embodiment

Figure 5:
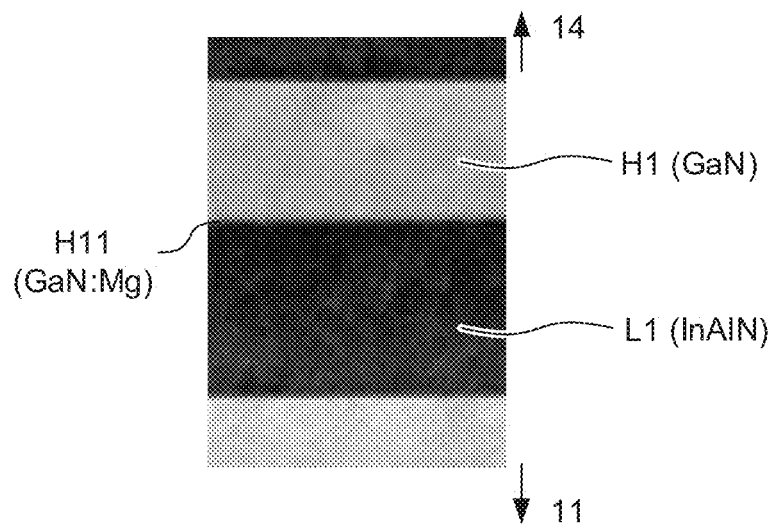
FIG. 5($a$) is an observation image by an electron microscope of a multilayer film reflecting mirror according to the second embodiment and FIG. 5($b$) is an observation image by an electron microscope of a multilayer film reflecting mirror according to the third embodiment.
Figure 5:
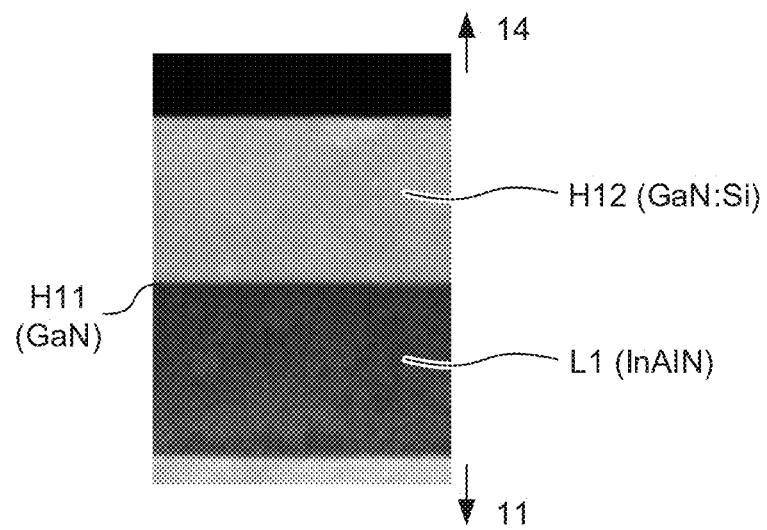

FIG. 5(a) is a TEM image of a semiconductor multilayer film reflecting mirror in a surface emitting laser according to a second embodiment. The semiconductor multilayer film reflecting mirror according to this embodiment has the same configuration as that of the semiconductor multilayer film reflecting mirror ML according to the first embodiment except that the first GaN layer H11 contains Mg instead of Si as a dopant. The Mg concentration of the first GaN layer H11 was set to $2\times10^{18}$ atoms/cm$^3$. However, the dopant concentration of the first GaN layer H11 may be $2\times10^{18}$ atoms/cm$^3$ or more.

As shown in FIG. 5(a), it is confirmed that even when the first GaN layer H11 contains Mg as a dopant, the flatness of the interface between the InAlN layer L1 and the GaN layer H1 is improved in the same manner as in the first embodiment. That is, the first GaN layer H1 contains not only an n-type dopant such as Si but also may contain a p-type dopant such as Mg.

Third Embodiment

FIG. 5(b) is a TEM image of a semiconductor multilayer film reflecting mirror in a surface emitting laser according to a third embodiment. The semiconductor multilayer film reflecting mirror according to this embodiment has the same configuration as that of the first embodiment, except that the GaN layer H11 of the GaN layer H1 does not contain the dopant, but the second GaN layer H12 contains a dopant. In this embodiment, the second GaN layer H12 contains Si as a dopant, and the dopant concentration thereof is $6\times10^{18}$ atoms/cm$^3$. The dopant concentration of the second GaN layer H12 only needs to be $3*10^{18}$ atoms/cm$^3$ or more.

As shown in FIG. 5(b), it is confirmed that even when the second GaN layer H12 is doped, the flatness of the interface between the InAlN layer L1 and the GaN layer H1 is improved in the same manner as in the first embodiment. Therefore, when the GaN layer H1 includes the first and second GaN layers H11 and H12, any one of the first and second GaN layers H11 and H12 only needs to contain a dopant. Note that even when the second GaN layer H12 contains a dopant as in the second embodiment, it is inferred that the dopant may be Mg.

In the embodiments described above, the substrate 11 is a GaN substrate, and the InAlN layer L1 and the GaN layer H1 are grown using the GaN substrate as a growth substrate to produce a semiconductor multilayer film reflecting mirror. However, the substrate 11 of the semiconductor multilayer film reflecting mirror may be any other substrates, for example, a sapphire substrate.

In the embodiments described above, the surface emitting laser has a semiconductor multilayer film reflecting mirror, and the semiconductor multilayer film reflecting mirror has the substrate 11 and the semiconductor multilayer film which is formed on the substrate 11 and in which the non-doped InAlN layer L1 and the GaN layer H1 formed on the InAlN layer L1 and containing a dopant are stacked a plurality of times. Accordingly, it is possible to provide a multilayer film reflecting mirror having a high reflectance with a small number of layers, and a vertical cavity light-emitting element having the multilayer film reflecting mirror to possess a low lasing threshold.

REFERENCE SIGNS LIST 10 semiconductor laser (vertical cavity light-emitting element)
ML semiconductor multilayer film reflecting mirror
L1 InAlN layer
H11 first GaN layer
H12 second GaN layer

The invention claimed is:
1. A semiconductor multilayer film reflecting mirror comprising:
   a substrate; and
   a semiconductor multilayer film which is formed on said substrate and which includes a plurality of first layers and a plurality of second layers which are stacked on each other in an alternating manner,
   wherein each of said first layers comprises a non-doped InAlN layer, and
   wherein each of said second layers comprises a GaN layer containing a dopant.
2. The semiconductor multilayer film reflecting mirror according to claim 1, wherein said dopant is Si.
3. The semiconductor multilayer film reflecting mirror according to claim 2, wherein an Si concentration is at least $3\times10^{18}$ atoms/cm$^3$ in said GaN layer containing said dopant in each of said second layers.
4. The semiconductor multilayer film reflecting mirror according to claim 1, wherein said dopant is Mg.
5. The semiconductor multilayer film reflecting mirror according to claim 1, wherein each of said second layers consists of a first GaN layer and a second GaN layer, and only one of said first GaN layer or said second GaN layer contains said dopant.
6. The semiconductor multilayer film reflecting mirror according to claim 5, wherein each of said first layers consist of a single non-doped InAlN layer.
7. The semiconductor multilayer film reflecting mirror according to claim 6, wherein, in each of said second layers, said first GaN layer contains said dopant and said second GaN layer does not contain said dopant, and
   wherein said plurality of first layers and said plurality of second layers are stacked on each other in said semiconductor multilayer film such that said first GaN layer of said second layers is stacked on a surface of said InAlN layer of said first layers.
8. The semiconductor multilayer film reflecting mirror according to claim 7, wherein, in each of said second layers, said first GaN layer is thinner than said second GaN layer.
9. A vertical cavity light-emitting element comprising:
   a semiconductor structure layer including a first semiconductor layer having a first conductivity type, an active layer, and a second semiconductor layer having a second conductivity type opposite to said first conductivity type; and
   first and second reflecting mirrors opposite to each other with said semiconductor structure layer interposed therebetween,
   wherein:

said first reflecting mirror comprises a semiconductor multilayer film which includes a plurality of first layers and a plurality of second layers which are stacked on each other in an alternating manner,
wherein each of said first layers comprises a non-doped InAlN layer; and
wherein each of said second layers comprises a GaN layer containing a dopant.

* * * * *